(12) United States Patent
Barr

(10) Patent No.: US 7,147,514 B2
(45) Date of Patent: Dec. 12, 2006

(54) CONNECTOR PROVIDING CAPACITIVE COUPLING

(75) Inventor: Andrew Harvey Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/773,009

(22) Filed: Feb. 5, 2004

(65) Prior Publication Data

US 2005/0176301 A1 Aug. 11, 2005

(51) Int. Cl.
*H01R 13/66* (2006.01)
(52) U.S. Cl. .................................. 439/620.09
(58) Field of Classification Search ............ 439/620, 439/620.09, 620.2
See application file for complete search history.

(56) References Cited

U.S. PATENT DOCUMENTS

| | | | | |
|---|---|---|---|---|
| 4,734,818 A * | 3/1988 | Hernandez et al. | ...... | 361/306.2 |
| 4,751,435 A * | 6/1988 | Roche et al. | ...... | 315/235 |
| 4,784,618 A * | 11/1988 | Sakamoto et al. | ...... | 439/620 |
| 5,039,963 A * | 8/1991 | Fischer | ...... | 333/173 |
| 5,145,413 A * | 9/1992 | Okamoto et al. | ...... | 439/620 |
| 5,188,543 A * | 2/1993 | Swift | ...... | 439/620 |
| 5,192,231 A * | 3/1993 | Dolin, Jr. | ...... | 439/620 |
| 5,403,195 A * | 4/1995 | Thrush et al. | ...... | 439/69 |
| 5,687,233 A * | 11/1997 | Loudermilk et al. | ...... | 439/620 |
| 5,851,122 A * | 12/1998 | Huber et al. | ...... | 439/620 |
| 5,967,848 A * | 10/1999 | Johnson et al. | ...... | 439/620 |
| 6,186,834 B1* | 2/2001 | Arnett et al. | ...... | 439/676 |
| 6,544,061 B1* | 4/2003 | Yasufuku et al. | ...... | 439/310 |
| 6,654,840 B1* | 11/2003 | Gendo et al. | ...... | 439/620 |
| 2004/0248432 A1 | 12/2004 | Barr | | |

* cited by examiner

*Primary Examiner*—Tho D. Ta

(57) ABSTRACT

A connector provides capacitive coupling between circuit devices such as printed circuitboards and integrated circuits. The connector includes at least a first contact that contacts a conductor of the first circuit device, a second contact that contacts a conductor of the second circuit device, and a capacitor coupled between the first and second contacts. The connector includes an insulative body that encapsulate the capacitor and carries the first and second contacts. The connector may further include a plurality of the first contacts, a like plurality of the second contacts, and a like plurality of AC blocking capacitors with each capacitor being coupled between a respective different pair of the first contacts and second contacts.

40 Claims, 3 Drawing Sheets

CONNECTOR PROVIDING CAPACITIVE COUPLING

BACKGROUND OF THE INVENTION

It is often necessary to distribute high-speed signals, such as high-speed differential signals, from one circuit device, such as an integrated circuit or printed circuitboard, to another such circuit device. This may require capacitive or "AC" coupling.

Typically, high-speed signals requiring such AC coupling are routed within internal layers of multi-layered substrates of printed circuitboards or integrated circuits, as known in the art. To provide AC-coupling, coupling or blocking capacitors are used which are mounted on the circuit device substrates (printed circuitboard). To permit the high-speed signals access to the AC blocking capacitors, the signals must be brought to the surface layers of the circuit devices through vias. These vias can have a significant deleterious effect on the signal quality and integrity, especially for high-speed signals having frequencies in the multiple gigabit range. In addition, the adverse signal quality effects increase as the circuit device substrate thickness increases.

Unless preventative measures are taken, the problem will only worsen. As signal rate increases, signal energy content increases, and signal frequency increases, the adverse effects of the vias will prove even more difficult to deal with.

Previous solutions have included ignoring the problem and living with the detrimental effects caused by the vias. Another solution has been to use blind or buried vias where the vias only extend partially through the circuit device substrates. Unfortunately, this increases manufacturing costs of the circuit devices. Another solution has been to back drill the vias to remove unused portions of the vias. This also results in increased manufacturing costs.

The present invention provides a solution to the above-noted problems. As will be seen subsequently, the present invention permits signals to be distributed from one circuit device to another while negating the need for the previously employed vias for accessing surface mounted AC blocking capacitors.

SUMMARY OF THE INVENTION

In one embodiment of the invention, a connector includes a first contact that contacts a conductor of a first circuit, a second contact that contacts a conductor of a second circuit, and a capacitor coupled between the first and second contacts. As a result, the connector capacitively couples the conductor of the first circuit to the conductor of the second circuit.

In various embodiments, the connector may further include an electrically insulative body encapsulating the capacitor and carrying the first and second contacts. One of the first and second contacts may be a male contact or a female contact.

In accordance with further aspects of the invention, the first and second contacts may be disposed along a substantially common line or substantially transverse to each other.

In accordance with a further embodiment, the connector may include a plurality of first contacts, a like plurality of second contacts, and a like plurality of capacitors with each capacitor coupled between a different respective pair of the first and second contacts. The plurality of first contacts and the plurality of second contacts may lie in a substantially common plane. The connector may further include a plurality of contact sets of the plurality of first and second contacts lying in a substantially common plane. The plural contact sets may be disposed substantially parallel to each other.

In accordance with the present invention, first and second device circuits may be capacitively coupled together without requiring vias for accessing AC blocking capacitors. One of the first and second circuits may be an integrated circuit or a printed circuitboard.

These and various other features as well as advantages of the present invention will be apparent from a reading of the following detailed description and a review of the associated drawings.

DESCRIPTION OF THE INVENTION

In the following detailed description of an exemplary embodiment of the invention, reference is made to the accompanying drawings, which form a part hereof. The detailed description and drawings illustrates specific exemplary embodiments by which the invention may be practiced. These embodiments are described in sufficient detail to enable those skilled in the art to practice the invention. It is understood that other embodiments may be utilized, and other changes may be made, without departing from the spirit or scope of the present invention. The following detailed description is therefore not to be taken in a limiting sense, and the scope of the present invention is defined by the appended claims.

Figure 1:
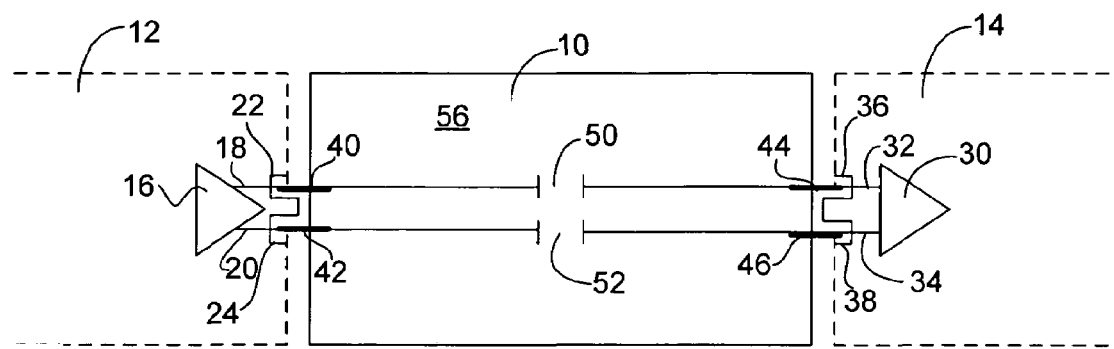
FIG. 1 is a generally schematic representation of a connector that embodies the present invention and capacitively connects conductors of a first circuit device to conductors or a second circuit device.

FIG. 1 schematically illustrates a first embodiment of the present invention. Here, a connector 10, embodying the present invention, capacitively couples conductors of a first circuit device 12 to conductors of a second circuit device 14. The first circuit device 12 includes a differential signal driver 16 of the type which generates a high-speed differential signal output on conductors 18 and 20. The conductors 18 and 20 are coupled to female contacts 22 and 24 respectively, which are carried by the circuit device 12.

Similarly, the second circuit device 14 includes a second differential signal driver 30 of the type which may receive the high-speed differential signals provided by the first differential signal driver 16. The differential signal driver 30 receives the differential signals over conductors 32 and 34 which are coupled to female contacts 36 and 38 respectively, carried by the circuit device 14.

The connector 10 capacitively couples the female contact 22 of the first circuit device 12 to the female contact 36 of the second circuit device 14 and the female contact 24 of the first circuit device 12 to the female contact 38 of the second circuit device 14. The connector 10 includes a first pair of male contacts 40 and 42 and a second pair of male contacts 44 and 46. Contacts 40 and 42 are arranged to be connectively received by the female contacts 22 and 24. Similarly, the contacts 44 and 46 are arrangement to be connectively received by the female contacts 36 and 38. The connector 10 further includes AC blocking capacitors 50 and 52. The capacitor 50 is coupled between contact 40 and contact 44 and the capacitor 52 is coupled between the contact 42 and the contact 46.

As a result of the foregoing, when the contacts 40 and 42 are received by contacts 18 and 24, and contacts 44 and 46 are received by contacts 36 and 38, the connector 10 capacitively couples conductors 18 and 20 of the first circuit device 12 to conductors 32 and 34 respectively of the second circuit device 44. The connector 10 further includes a body 56 of electrically insulative material in which the capacitors 50 and 52 are imbedded and which carries the contacts 40, 42, 44, and 46. The body 56 may be formed by injection molding or in any other manner known in the art.

Figure 2:
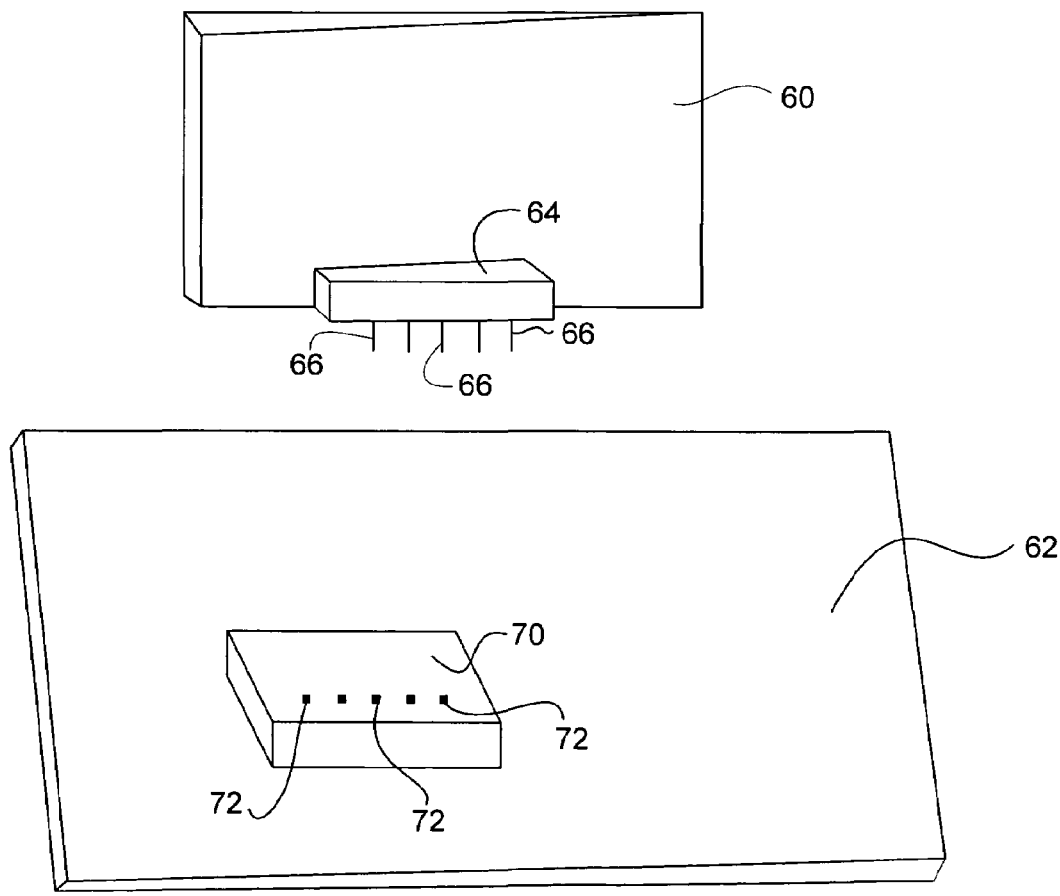
FIG. 2 illustrates a prospective view of first and second printed circuitboards to be capacitively interconnected by a connector embodiment of the present invention.

Referring now to FIG. 2, it illustrates another embodiment of the invention where a first printed circuitboard 60 is capacitively coupled to a second printed circuitboard 62. The first printed circuitboard 60 includes a connector 64 embodying the present invention. The connector 64 includes a plurality of male contacts 66.

The second printed circuitboard 62 also includes a connector 70 which may embody the present invention. The connector 70 includes a plurality of female contacts 72 which are arranged to connectively receive the contacts 66 carried by the connector 64.

Figure 3:
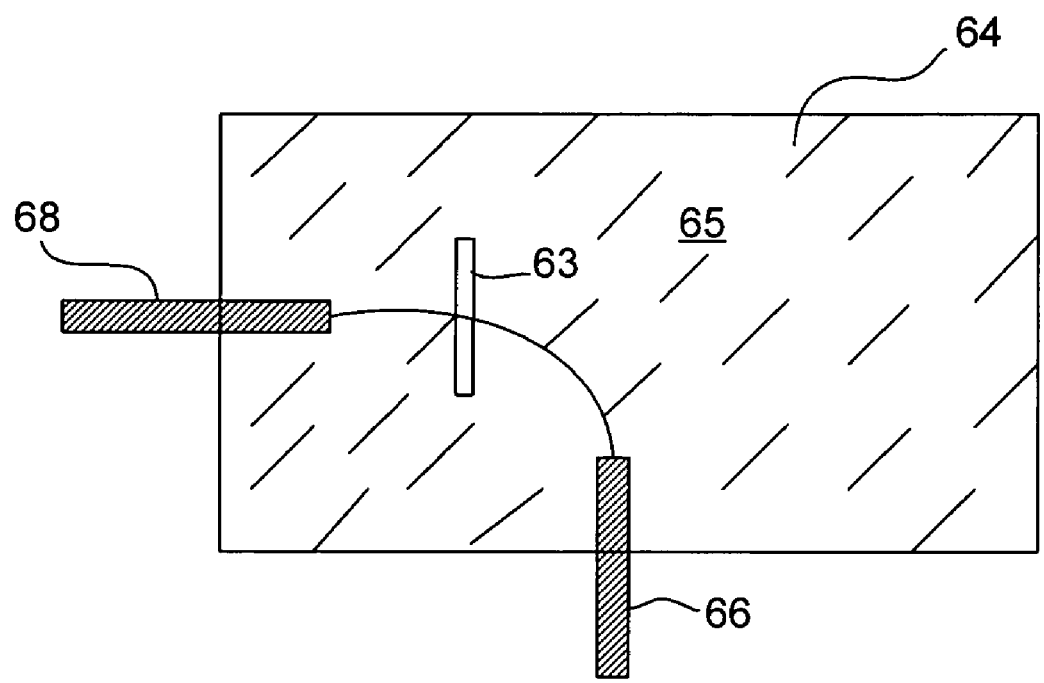
FIG. 3 is a cross-sectional side view of one embodiment of the present invention wherein a connector includes contacts disposed substantially transverse to one another with an AC coupling capacitor coupled between the connector contacts.

FIG. 3 shows that the connector 64 may further include a further plurality of male contacts 68 which are arranged substantially transverse to the contacts 66. Coupled between the contacts 66 and 68 is an AC blocking capacitor 63 which may capacitively couple a conductor on printed circuitboard 60 to a conductor on printed circuitboard 62.

Lastly, it will be noted in FIG. 3 that the connector 64 includes a body 65. The body 65 is preferably formed of an electrically insulative material for carrying the contacts 66 and 68 and imbedding the capacitor 63. To that end, the body 65 may be formed by injection molding or many other molding methods known in the art.

Figure 4:
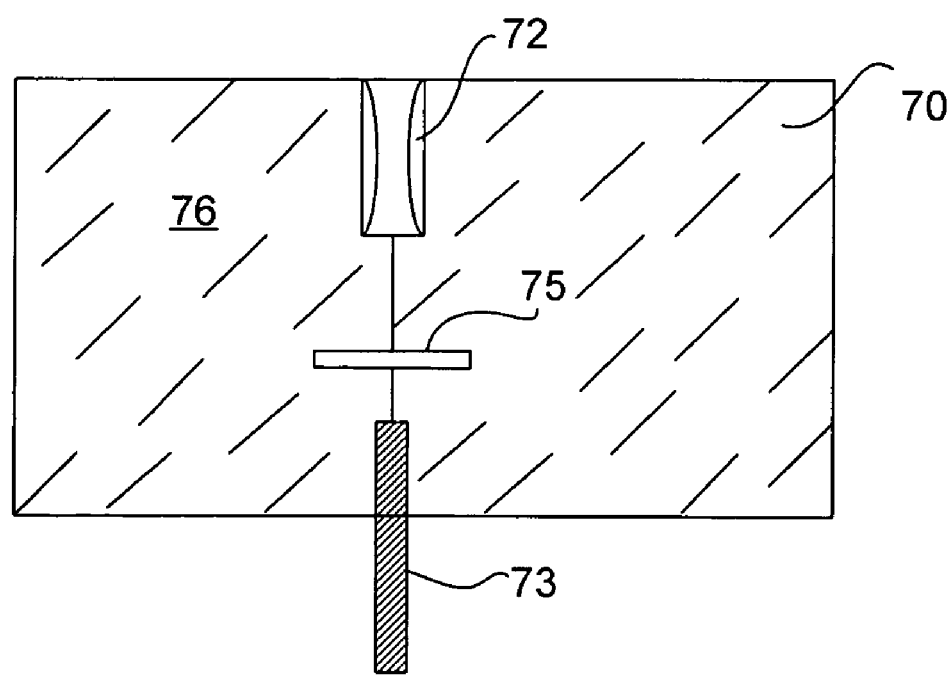
FIG. 4 is a cross-sectional side view of a further embodiment of the present invention wherein a connector includes a male contact and a female contact coupled together by an AC blocking capacitor and wherein the contacts are disposed along substantially common line.

FIG. 4 illustrates a form in which the connector 70 may take to embody the present invention. Here, one female contact 72 of the plurality of female contacts is illustrated disposed substantially in line with a corresponding male contact 73. Although not illustrated, the connector 70 may include a male contact for each female contact 72. An AC blocking capacitor 75 couples the female contact 72 to the male contact 73. The connector 70 further includes a body 76 which is molded to encapsulate the capacitor 75 and carry the contacts 72 and 73.

In order to provide capacitive coupling between a conductor of printed circuitboard 60 and a conductor of printed circuitboard 62, only one of the connectors 64 and 70 need incorporate an AC blocking capacitor. Hence, if connector 64 includes the capacitor 63, then connector 70 need not include capacitor 75 and the contact 72 may be directly coupled to the contact 73 without an intervening AC blocking capacitor. Similarly, if the connector 70 is to provide the capacitive coupling with capacitor 75, then connector 64 need not include capacitor 63. In this case, contact 68 would be coupled directly to contact 66 without an intervening capacitor 63.

Figure 5:
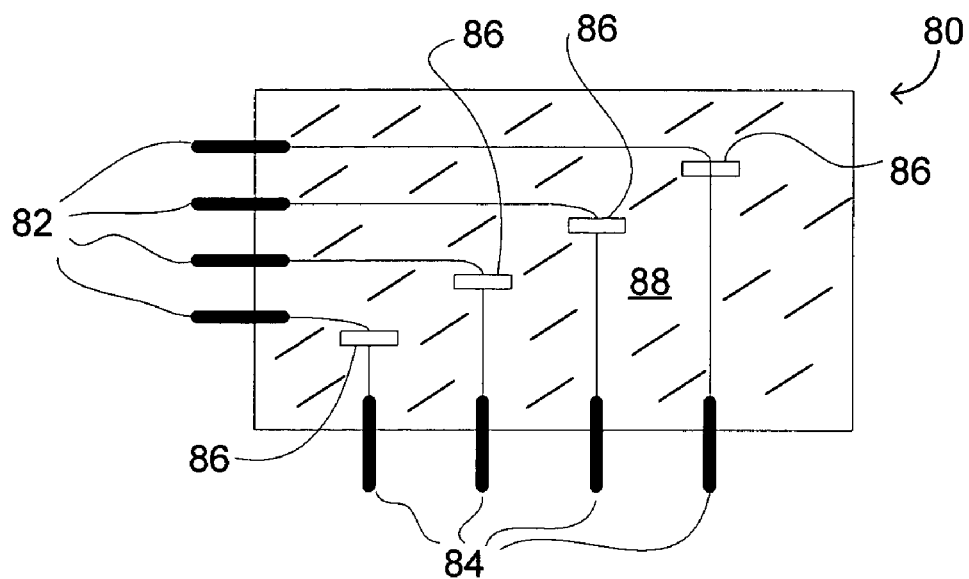
FIG. 5 is a cross-sectional side view of a still further embodiment of the present invention wherein a connector includes a plurality of contact pairs each pair being coupled together by an AC blocking capacitor and wherein all of the contacts lie within a substantially common plane.

FIG. 5 illustrates a further embodiment of the present invention. Here, a connector 80 is shown in cross-section. The connector 80 includes a plurality of first contacts 82 and a plurality of second contacts 84. Coupling each respective first contact with a respective second contact is an AC blocking capacitor 86. In accordance with this embodiment, the first contacts 82 and second contacts 84 lie within a substantially common plane. Also, the contacts 82 and 84 are disposed substantially transverse to each other.

The connector 80 still further includes a body 88. The body 88 may be molded to carry the contacts 82 and 84 and encapsulate the capacitors 86.

Figure 6:
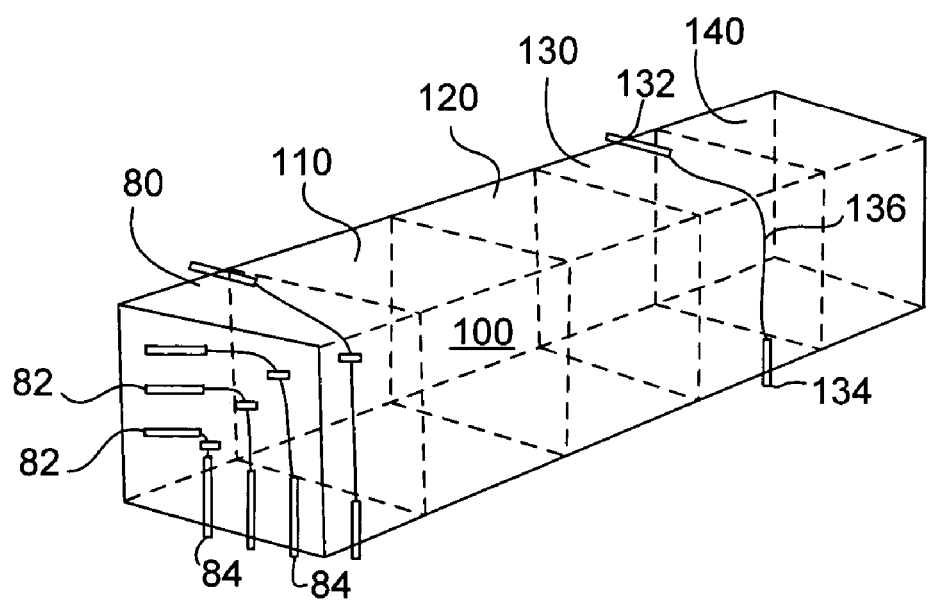
FIG. 6 is a perspective view of a still further embodiment of the present invention illustrating how a connector may be modularly constructed in accordance with further aspects of the present invention.

FIG. 6 illustrates how the connector 80 may be employed to form one segment of a bladed style connector 100. In FIG. 6, it will be noted that the connector 100 includes a plurality of connector segments 80, 110, 120, 130, and 140, for example. Although five such segments are illustrated in FIG. 6, it is to be understood that the connector 80 may include any number of connector segments without departing from the present invention.

The modularized structure of connector 100 permits a plurality of connector segments to be disposed with contact substantially parallel to each other. Further, the modularized structure of the connector 100 permits connector segments which provide capacitive coupling, such as segment 80 to be utilized along with connector segments, such as segment 130, which provide coupling but not capacitive coupling. Connector segment 130 is illustrated as an example of one connector segment which may be provided for providing direct and not AC coupled coupling. As will be noted in FIG. 6, the segment 130 includes a first male contact 132 and a second male contact 134. The contacts 32 and 34 are directly coupled together by a conductor 136. Of course, as will be appreciated by those skilled in the art, the connector segment 130 may incorporate a plurality of the male contacts 132 and a corresponding plurality of male contacts 134.

Also, a modularized structure of the connector 100 permits the contacts providing capacitive coupling to be distinguishable from the contacts which do not provide capacitive coupling. To that end, the contacts 82 and 84 may have a characteristic which distinguishes them from the contacts 132 and 134. This distinguishing characteristic may be, for example, cross-sectional shape or other physical distinguishing characteristic.

As can be appreciated from the foregoing, the present invention provides a connector for distributing signals from one circuit device to another circuit device with capacitive coupling without requiring the circuit devices to incorporate surface mounted AC blocking capacitors and vias for accessing such capacitors. As a result, the deleterious effects of such vias are avoided without increasing the manufacturing costs of the circuit devices.

Although the present invention has been described in considerable detail with reference to certain preferred embodiments, other embodiments are possible. Therefore, the spirit or scope of the appended claims should not be limited to the description of the embodiments contained therein. It is intended that the invention resides in the claims.

The invention claimed is:

1. A connector comprising:
   a first contact that contacts a conductor of a first circuit in a first circuit board;
   a second contact that contacts a conductor of a second circuit in either the first circuit board or a second circuit board; and
   a capacitor coupled to the first and second contacts, wherein the first and second contacts are coupled to each other via the capacitor only whereby,
   the connector capacitively couples the conductor of the first circuit to the conductor of the second circuit.

2. The connector of claim 1 further comprising an electrically insulative body encapsulating the capacitor and carrying the first and second contacts.

3. The connector of claim 1 wherein one of the first and second contacts is a male contact.

4. The connector of claim 1 wherein one of the first and second contacts is a female contact.

5. The connector of claim 1 wherein the first and second contacts are disposed along a substantially common line.

6. The connector of claim 1 wherein the first and second contacts are disposed substantially transverse to each other.

7. The connector of claim 1 wherein one of the first and second circuits is an integrated circuit.

8. The connector of claim 1 wherein one of the first and second circuits is a printed circuitboard.

9. The connector of claim 1 comprising a plurality of first contacts, a like plurality of second contacts, and a like plurality of capacitors, each capacitor coupled between a different respective pair of the first and second contacts.

10. The connector of claim 9 wherein the plurality of first contacts and the plurality of second contacts lie in a substantially common plane.

11. The connector of claim 10 comprising plural contact sets of the plurality of first and second contacts lying in a substantially common plane.

12. The connector of claim 11 wherein the plural contact sets are disposed substantially parallel to each other.

13. The connector of claim 9 wherein the plurality of first contacts and the plurality of second contacts are divided into contact sets and wherein the first and second contacts of each contact set lie in a substantially common plane.

14. The connector of claim 13 wherein the contact sets are disposed substantially parallel to each other.

15. A connector comprising:
    an insulative body;
    a first contact carried by the body that contacts a conductor of a first circuit in a first circuit board;
    a second contact carried by the body that contacts a conductor of a second circuit in either the first circuit board or a second circuit board; and
    a capacitor encapsulated within the body and coupled to the first and second contacts, wherein the first and second contacts are coupled to each other via the capacitor only
    the connector capacitively couples the conductor of the first circuit to the conductor of the second circuit.

16. The connector of claim 15 wherein one of the first and second contacts is a male contact.

17. The connector of claim 15 wherein one of the first and second contacts is a female contact.

18. The connector of claim 15 wherein the first and second contacts are disposed along a substantially common line.

19. The connector of claim 15 wherein the first and second contacts are disposed substantially transverse to each other.

20. The connector of claim 15 wherein one of the first and second circuits is an integrated circuit.

21. The connector of claim 15 comprising a plurality of first contacts, a like plurality of second contacts, and a like plurality of capacitors, each capacitor coupled between a different respective pair of the first and second contacts.

22. The connector of claim 21 wherein the plurality of first contacts and the plurality of second contacts lie in a substantially common plane.

23. The connector of claim 22 comprising plural contact sets of the plurality of first and second contacts lying in a substantially common plane.

24. The connector of claim 23 wherein the plural contact sets are disposed substantially parallel to each other.

25. A connector comprising:
    a plurality of first contacts, each first contact contacting a respective one of a like plurality of conductors of a first circuit in a first circuit board;
    a second like plurality of contacts, each second contact contacting a respective one of a like plurality of conductors of a second circuit in either the first circuit board or a second circuit board and
    a like plurality of capacitors coupled between respective pairs of the first and second contacts, each capacitor being serially coupled only to a respective pair of the first and second contacts whereby,
    the connector capacitively couples each conductor of the first circuit to a corresponding respective conductor of the second circuit.

26. The connector of claim 25 further comprising an electrically insulative body encapsulating the capacitor and carrying the first and second contacts.

27. The connector of claim 25 wherein corresponding first and second contacts are disposed along a substantially common line.

28. The connector of claim 25 wherein the first contacts and the second contacts are disposed substantially transverse to each other.

29. A connector comprising:
    a first contact that contacts a conductor of a first circuit in a first circuit board;
    a second contact that contacts a conductor of a second circuit in either the first circuit board or a second circuit board;
    a capacitor coupled between the first and second contacts, the capacitor being serially coupled only to the first and second contacts whereby, the connector capacitively couples the conductor of the first circuit to the conductor of the second circuit; and
    wherein the first and second contacts are disposed along a substantially common line.

30. A connector comprising:
    a first contact that contacts a conductor of a first circuit in a first circuit board;
    a second contact that contacts a conductor of a second circuit in either the first circuit board or a second circuit board;
    a capacitor coupled between the first and second contacts, the capacitor being serially coupled only to the first and second contacts whereby, the connector capacitively couples the conductor of the first circuit to the conductor of the second circuit; and
    wherein the connector comprises a plurality of first contacts, a like plurality of second contacts, and a like plurality of capacitors, each capacitor coupled between a different respective pair of the first and second contacts.

31. The connector of claim 30 wherein the plurality of first contacts and the plurality of second contacts lie in a substantially common plane.

32. The connector of claim 31 comprising plural contact sets of the plurality of first and second contacts lying in a substantially common plane.

33. The connector of claim 32 wherein the plural contact sets are disposed substantially parallel to each other.

34. The connector of claim 30 wherein the plurality of first contacts and the plurality of second contacts are divided into contact sets and wherein the first and second contacts of each contact set lie in a substantially common plane.

35. The connector of claim 34 wherein the contact sets are disposed substantially parallel to each other.

36. A connector comprising:
an insulative body;
a first contact carried by the body that contacts a conductor of a first circuit in a first circuit board;
a second contact carried by the body that contacts a conductor of a second circuit in either the first circuit board or a second circuit board;
a capacitor encapsulated within the body and coupled between the first and second contacts, the capacitor being serially coupled only to the first and second contacts whereby, the connector capacitively couples the conductor of the first circuit to the conductor of the second circuit; and
wherein the first and second contacts are disposed along a substantially common line.

37. A connector comprising:
an insulative body;
a first contact carried by the body that contacts a conductor of a first circuit in a first circuit board;
a second contact carried by the body that contacts a conductor of a second circuit in either the first circuit board or a second circuit board;
a capacitor encapsulated within the body and coupled between the first and second contacts, the capacitor being serially coupled only to the first and second contacts whereby, the connector capacitively couples the conductor of the first circuit to the conductor of the second circuit; and
the connector comprises a plurality of first contacts, a like plurality of second contacts, and a like plurality of capacitors, each capacitor coupled between a different respective pair of the first and second contacts.

38. The connector of claim 37 wherein the plurality of first contacts and the plurality of second contacts lie in a substantially common plane.

39. The connector of claim 38 comprising plural contact sets of the plurality of first and second contacts lying in a substantially common plane.

40. The connector of claim 39 wherein the plural contact sets are disposed substantially parallel to each other.

* * * * *

UNITED STATES PATENT AND TRADEMARK OFFICE
CERTIFICATE OF CORRECTION

| | |
|---|---|
| PATENT NO. | : 7,147,514 B2 |
| APPLICATION NO. | : 10/773009 |
| DATED | : December 12, 2006 |
| INVENTOR(S) | : Andrew Harvey Barr |

Page 1 of 1

It is certified that error appears in the above-identified patent and that said Letters Patent is hereby corrected as shown below:

In column 5, line 57, in Claim 15, after "only" insert -- whereby, --.

Signed and Sealed this

Twenty-second Day of December, 2009

David J. Kappos
*Director of the United States Patent and Trademark Office*